US011797833B2

(12) United States Patent
Burr et al.

(10) Patent No.: US 11,797,833 B2
(45) Date of Patent: Oct. 24, 2023

(54) COMPETITIVE MACHINE LEARNING ACCURACY ON NEUROMORPHIC ARRAYS WITH NON-IDEAL NON-VOLATILE MEMORY DEVICES

(71) Applicant: INTERNATIONAL BUSINESS MACHINES CORPORATION, Armonk, NY (US)

(72) Inventors: Geoffrey W. Burr, San Jose, CA (US); Pritish Narayanan, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1310 days.

(21) Appl. No.: 15/812,612

(22) Filed: Nov. 14, 2017

(65) Prior Publication Data
US 2019/0147328 A1    May 16, 2019

(51) Int. Cl.
*G06N 3/065*   (2023.01)
*G06N 3/084*   (2023.01)
(Continued)

(52) U.S. Cl.
CPC ............ *G06N 3/065* (2023.01); *G06N 3/084* (2013.01); *G11C 11/401* (2013.01);
(Continued)

(58) Field of Classification Search
CPC .................................................. G06N 3/0635
See application file for complete search history.

(56) References Cited

U.S. PATENT DOCUMENTS 4,903,226 A * 2/1990 Tsividis ................. G06N 3/063
708/801
4,956,564 A * 9/1990 Holler .................... G06N 3/063
365/49.1

(Continued)

FOREIGN PATENT DOCUMENTS

CN    206147705 U    5/2017
JP    06068287 A     3/1994

OTHER PUBLICATIONS

Y. He and U. Cilingiroglu, "A charge-based on-chip adaptation Kohonen neural network," in IEEE Transactions on Neural Networks, vol. 4, No. 3, pp. 462-469, May 1993, doi: 10.1109/72.217189. (Year: 1993).*

(Continued)

*Primary Examiner* — James D. Rutten
(74) *Attorney, Agent, or Firm* — Erik A. Huestis; Stephen J. Kenny; Foley Hoag LLP

(57) ABSTRACT

Optimized synapses for neuromorphic arrays are provided. In various embodiments, first and second single-transistor current sources are electrically coupled in series. The first single-transistor current source is electrically coupled to both a first control circuit and second control circuit, free of any intervening logic gate between the first single-transistor current source and either one of the control circuits. The second single-transistor current source is electrically coupled to both the first control circuit and the second control circuit, free of any intervening logic gate between the second single-transistor current source and either one of the control circuits. A capacitor is electrically coupled to the first and second single-transistor current sources. A read circuit is electrically coupled to the capacitor. The first and second single-transistor current sources are adapted to charge the capacitor only when concurrently receiving a control signal from both the first and second control circuits.

(Continued)

The first and second single-transistor current sources are adapted to discharge the capacitor only when concurrently receiving a control signal from both the first and second control circuit.

29 Claims, 10 Drawing Sheets

(51) Int. Cl.
    *G11C 11/54* (2006.01)
    *G11C 11/409* (2006.01)
    *G11C 27/00* (2006.01)
    *G11C 11/401* (2006.01)
(52) U.S. Cl.
    CPC ............ *G11C 11/409* (2013.01); *G11C 11/54* (2013.01); *G11C 27/00* (2013.01)

(56) References Cited

U.S. PATENT DOCUMENTS

| | | | | |
|---|---|---|---|---|
| 5,028,810 A * | 7/1991 | Castro | ................ | G06N 3/0635 365/185.03 |
| 5,302,863 A * | 4/1994 | Walley | ................ | G11C 27/026 327/60 |
| 6,225,929 B1 * | 5/2001 | Beck | ................ | H03M 1/808 341/144 |
| 6,642,752 B1 * | 11/2003 | Nagaraj | ................ | G11C 27/024 327/95 |
| 2002/0030205 A1 | 3/2002 | Varshavsky | | |
| 2002/0185690 A1 * | 12/2002 | Ueda | ................ | G11C 11/54 257/368 |
| 2005/0273284 A1 * | 12/2005 | Pickerd | ................ | H03M 1/123 702/66 |
| 2008/0056044 A1 * | 3/2008 | Tomita | ................ | G11C 11/4074 438/18 |
| 2008/0169836 A1 * | 7/2008 | Rahim | ................ | G11C 14/00 365/51 |
| 2012/0011092 A1 | 1/2012 | Tang et al. | | |
| 2015/0278681 A1 | 10/2015 | Saxena | | |
| 2016/0125287 A1 | 5/2016 | Pantazi et al. | | |
| 2016/0350647 A1 | 12/2016 | Hosokawa et al. | | |
| 2017/0083810 A1 | 3/2017 | Ielmini et al. | | |
| 2017/0329575 A1 * | 11/2017 | Gu | ................ | G11C 27/005 |
| 2018/0276537 A1 * | 9/2018 | Wood | ................ | G06N 3/049 |

OTHER PUBLICATIONS

T. Shibata, H. Kosaka, H. Ishii and T. Ohmi, "A neuron-MOS neural network using self-learning-compatible synapse circuits," in IEEE Journal of Solid-State Circuits, vol. 30, No. 8, pp. 913-922, Aug. 1995, doi: 10.1109/4.400434. (Year: 1995).*

P. Narayanan et al., "Toward on-chip acceleration of the backpropagation algorithm using nonvolatile memory," in IBM Journal of Research and Development, vol. 61, No. 4/5, pp. 11:1-11:11, Jul. 1-Sep. 2017, doi: 10.1147/JRD.2017.2716579. (Year: 2017).*

Pai-Yu Chen et al., "Technology-design co-optimization of resistive cross-point array for accelerating learning algorithms on chip" 2015 Design, Automation & Test in Europe Conference & Exhibition (2015), pp. 854-859.

Hyongsuk Kim et al., "Neural Synaptic Weighting With a Pulse-Based Memristor Circuit," IEEE Transactions on Circuits and Systems I: Regular Papers Year: 2012, vol. 59, Issue: 1, pp. 148-158.

Card et al., "Learning capacitive weights in analog CMOS neural networks," Journal of VLSI Signal Processing Systems for Signal, Image, and Video Technology, 8(3):209-225 (1994).

International Search Report and Written Opinion for International Application No. PCT/EP2018/080539 dated Jan. 29, 2019.

Kim et al., "Analog CMOS-based resistive processing unit for deep neural network training," 2017 IEEE 60th International Midwest Symposium on Circuits and Systems (MWSCAS), IEEE, 422-425 (2017).

* cited by examiner

COMPETITIVE MACHINE LEARNING ACCURACY ON NEUROMORPHIC ARRAYS WITH NON-IDEAL NON-VOLATILE MEMORY DEVICES

BACKGROUND

Embodiments of the present disclosure relate to artificial neural networks, and more specifically, to providing optimized synapses for neuromorphic arrays.

BRIEF SUMMARY

According to embodiments of the present disclosure, neural networks and related circuits are provided. First and second single-transistor current sources are electrically coupled in series. The first single-transistor current source is electrically coupled to both a first control circuit and a second control circuit, free of any intervening logic gate between the first single-transistor current source and either one of the control circuits. The second single-transistor current source is electrically coupled to the first control circuit and the second control circuit, free of any intervening logic gate between the second single-transistor current source and either one of the control circuits. A capacitor is electrically coupled to the first and second single-transistor current sources. A read circuit is electrically coupled to the capacitor. The first and second single-transistor current sources are adapted to charge the capacitor only when concurrently receiving a control signal from both the first and second control circuits. The first and second single-transistor current sources are adapted to discharge the capacitor only when concurrently receiving a control signal from both the first and second control circuit.

According to embodiments of the present disclosure, methods of, and computer program products for, training a neural network are provided. A control signal is received at a synapse from a first control circuit and from a second control circuit. The synapse comprises first and second single-transistor current sources electrically coupled in series and a capacitor electrically coupled to the first and second single-transistor current sources. The first single-transistor current source is electrically coupled to both the first control circuit and the second control circuit, free of any intervening logic gate between the first single-transistor current source and either one of the control circuits. The second single-transistor current source is also electrically coupled to the first control circuit and the second control circuit, free of any intervening logic gate between the second single-transistor current source and either one of the control circuits. The capacitor is charged or discharged according to the control signal received from both the first and second control circuits.

According to embodiments of the present disclosure a conductance-based synapse is provided. The synapse includes a circuit. The circuit includes at least two sets of peripheral control circuitry, at least two single-transistor current sources connected in series, and a capacitor connected with the at least two single-transistor current. The capacitor provides a weight based on a charge level of the capacitor. The capacitor is charged or discharged by at least one of the at least two single-transistor current sources only when both sets of control circuitry are signaling for a charge or discharge event.

DETAILED DESCRIPTION

Figure 1:
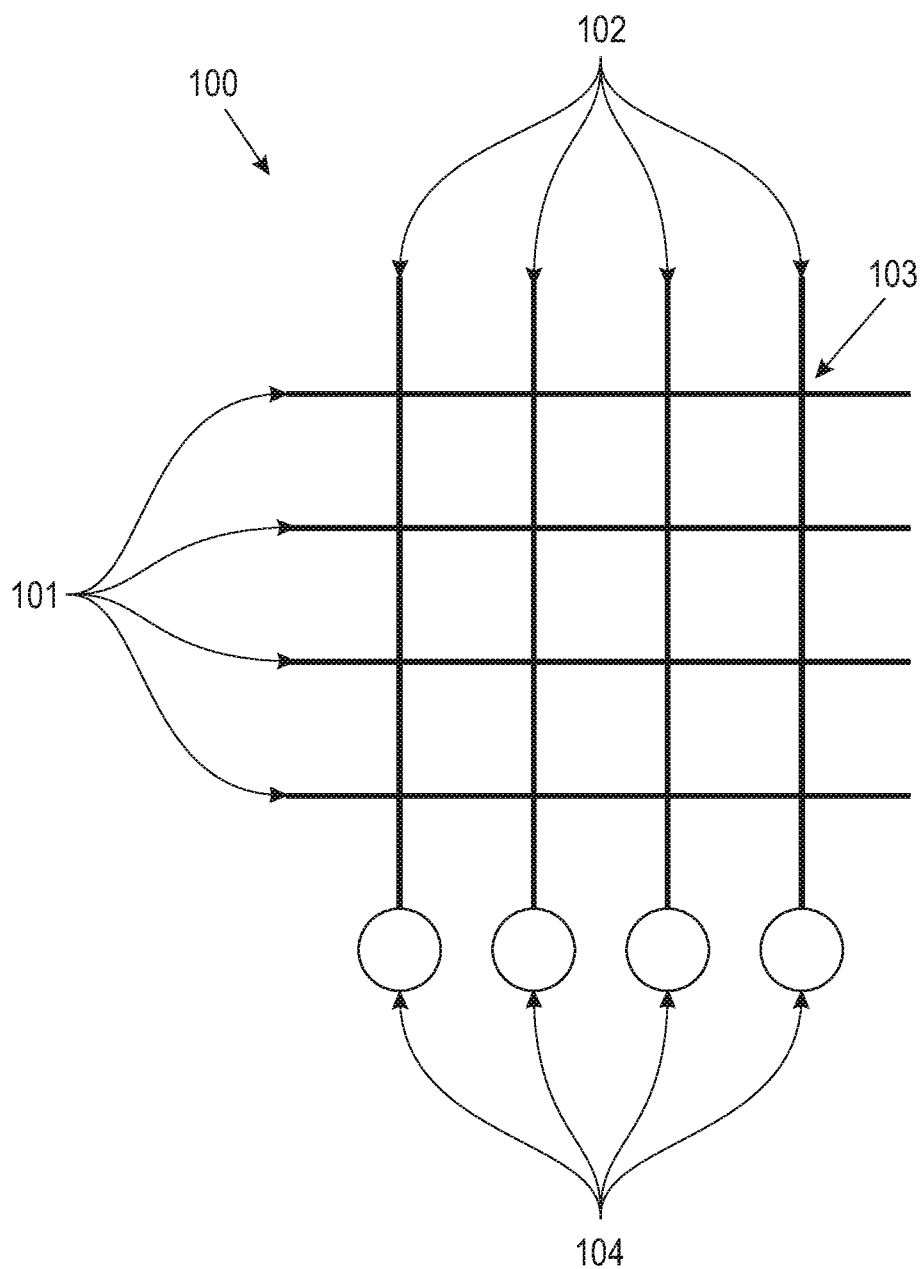
FIG. 1 illustrates an exemplary artificial neural network according to embodiments of the present disclosure.

Artificial neural networks (ANNs) are distributed computing systems, which consist of a number of neurons interconnected through connection points called synapses. Each synapse encodes the strength of the connection between the output of one neuron and the input of another. The output of each neuron is determined by the aggregate input received from other neurons that are connected to it. Thus, the output of a given neuron is based on the outputs of connected neurons from preceding layers and the strength of the connections as determined by the synaptic weights. An ANN is trained to solve a specific problem (e.g., pattern recognition) by adjusting the weights of the synapses such that a particular class of inputs produces a desired output.

Various algorithms may be used for this learning process. Certain algorithms may be suitable for specific tasks such as image recognition, speech recognition, or language processing. Training algorithms lead to a pattern of synaptic weights that, during the learning process, converges toward an optimal solution of the given problem. Backpropagation is one suitable algorithm for supervised learning, in which a known correct output is available during the learning process. The goal of such learning is to obtain a system that generalizes to data that were not available during training.

In general, during backpropagation, the output of the network is compared to the known correct output. An error value is calculated for each of the neurons in the output layer. The error values are propagated backwards, starting from the output layer, to determine an error value associated with each neuron. The error values are designed to improve each neuron's contribution to the network output. The error values are then used to update the weights. By incremental correction in this way, the network output is adjusted to conform to the training data.

Deep Neural Networks (DNNs) in particular are useful for a variety of applications in speech and object recognition. However, training DNNs is computationally intensive. In general, training DNNs relies on backpropagation, which is inherently local and parallel. Acceleration of training is possible by leveraging this locality and parallelism. For a fully connected DNN layer that maps neurons to neurons, significant acceleration can be achieved by minimizing data movement using local storage and processing. For example, computation may be computed on individual nodes and the nodes may be connected together in a systolic array. In this way, a given problem can be addressed in constant time independent of the array size. However, in this approach, the problem size is limited by the number of nodes in the array. In practice, scaling up an array to the billion-node range is a challenge even with the most advanced CMOS technologies.

Existing memory technologies such as phase change memory (PCM) and resistive random access memory (RRAM) may be used to implement a neural network. The estimated acceleration factors of such approaches are limited by device specifications intrinsic to their application as analog memory cells, even while providing a reduction in power and area.

Device characteristics considered beneficial (or at least not detrimental) in memory applications such as high on/off ratio, digital bit-wise storage, and asymmetrical set and reset operations, are limiting factors in the acceleration of DNN training. One approach to compensating for these non-ideal device characteristics in a DNN application is to provide complicated peripheral circuits and whole system design. However, such approaches provide only partial compensation, at a cost of significantly increased operational time.

In certain approaches, conductive synapses may be introduced, in which a transistor gate node is tied to a low-leakage capacitor. Such synapses require current sources to add or subtract charge from the capacitor only when both upstream neuron circuitry and downstream neuron circuitry call for a weight update. However, such approaches require that additional logic circuitry be included in every node to perform a logical AND operation between control signals from the upstream and downstream sets of neuron circuitry.

To provide simplified neural network circuitry and more efficient training, there is thus a need to for a compact synapse circuit that allows a state-bearing capacitor to be charged or discharged by single-transistor current sources without requiring any additional circuitry.

Accordingly, in various embodiments of the present disclosure, neural network circuitry is provided for highly linear and symmetric resistive processing using capacitor-based synapses. The capacitor is charged or discharged by one of two single-transistor current sources when both sets of control circuitry are signaling for a charge or discharge event.

With reference now to FIG. 1, an exemplary artificial neural network according to embodiments of the present disclosure is depicted. In some embodiments, neural network 100 includes axons 101, represented as rows, dendrites 102, represented as columns, synapses 103, represented as row-column junctions, and neurons 104 that receive inputs from dendrites. Information flows from axons 101 to the neurons 104, modulated by the synapses 103. In various embodiments, the synapses may be binary, and may be associated with synaptic weights.

Conductance-based synapses provide trainable resistive crosspoint circuit elements that can be used to build artificial neural networks (ANNs) such as of the one shown in FIG. 1. Such an approach dramatically accelerates an ANN over alternative approaches by providing local data storage and local data processing. A linear and symmetric conductance-change implementation is advantageous for analog memory-based ANN implementation.

As set forth herein, various conductance-based synapse circuits are provided that can provide highly linear and symmetric crossbar arrays (crosspoint arrays or crosswire arrays). Such circuits allow high density, low cost circuit architectures suitable for a variety of electronic circuits and devices, including ANNs, neuromorphic microchips, and ultra-high density nonvolatile memory. A basic crossbar array configuration includes a set of conductive row wires and a set of conductive column wires formed to intersect the set of conductive row wires, as illustrated in FIG. 1. The intersections between the two sets of wires are separated by crosspoint devices, which may be formed from thin film material.

Crosspoint devices function as an ANN's weighted connections between neurons. Nanoscale two-terminal devices, such as memristors with conduction state switching characteristics, may be used as crosspoint devices to emulate synaptic plasticity with high energy efficiency. The conduction state (e.g., resistance) of the memristive material may be altered by controlling the voltages applied between individual wires of the row and column wires.

As described briefly above, the backpropagation algorithm includes three cycles, forward propagation, back propagation, and weight update. These cycles are repeated until a convergence criterion is met. The forward and backward cycles involve computing vector-matrix multiplication. This operation can be performed on a 2D crossbar array of two terminal resistive devices. In the forward cycle, stored conductance values in the crossbar array form a matrix. The input vector is transmitted as voltage pulses through each of the input rows. In the backward cycle, when voltage pulses are supplied from columns as an input, then the vector-matrix product is computed on the transpose of a matrix. These operations achieve O(1) time complexity, but only for two out of three cycles of the training algorithm.

Figure 2A:
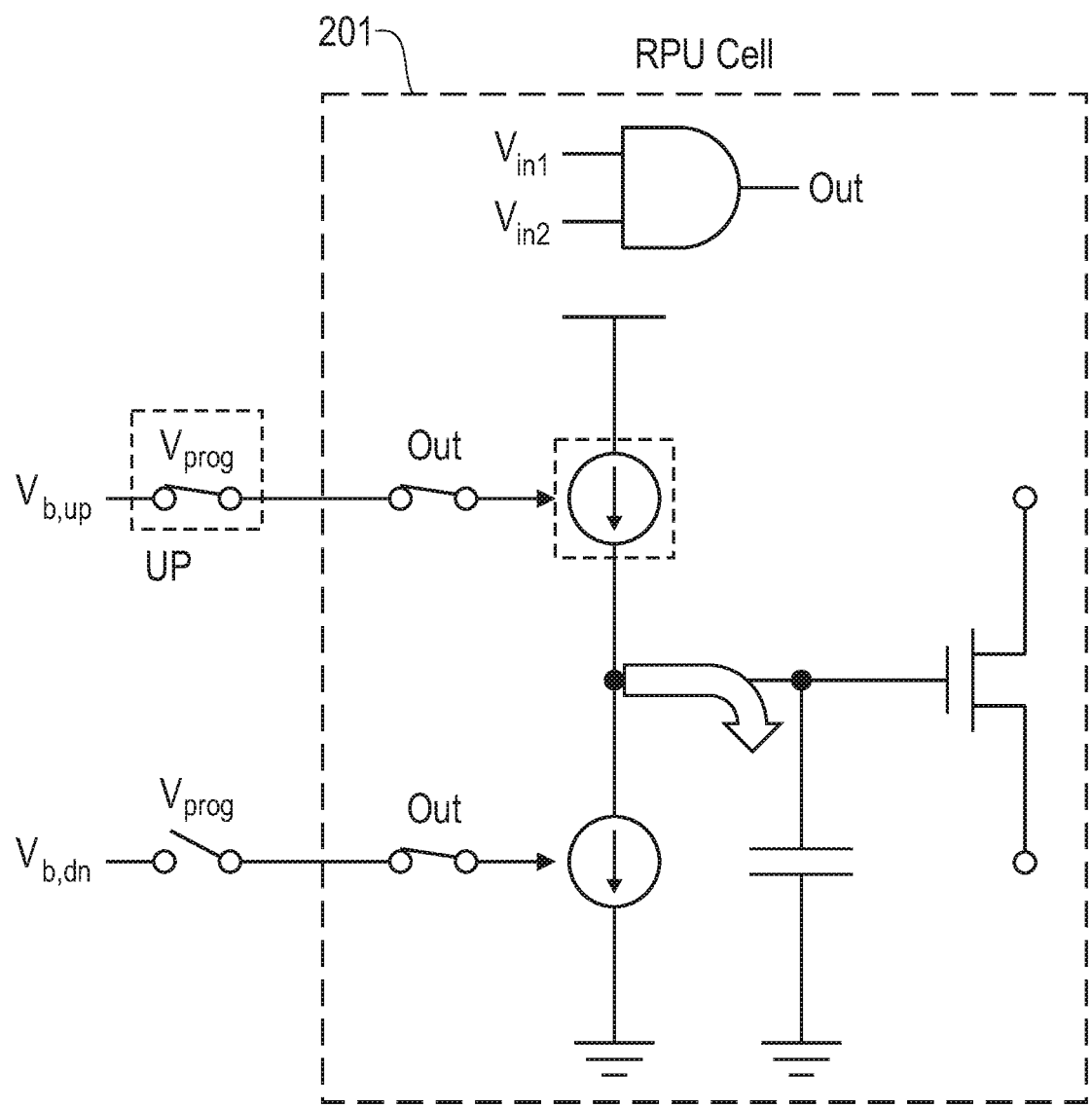
FIGS. 2A-B illustrate a conductance-based synapse during charge and discharge, respectively.
Figure 2B:
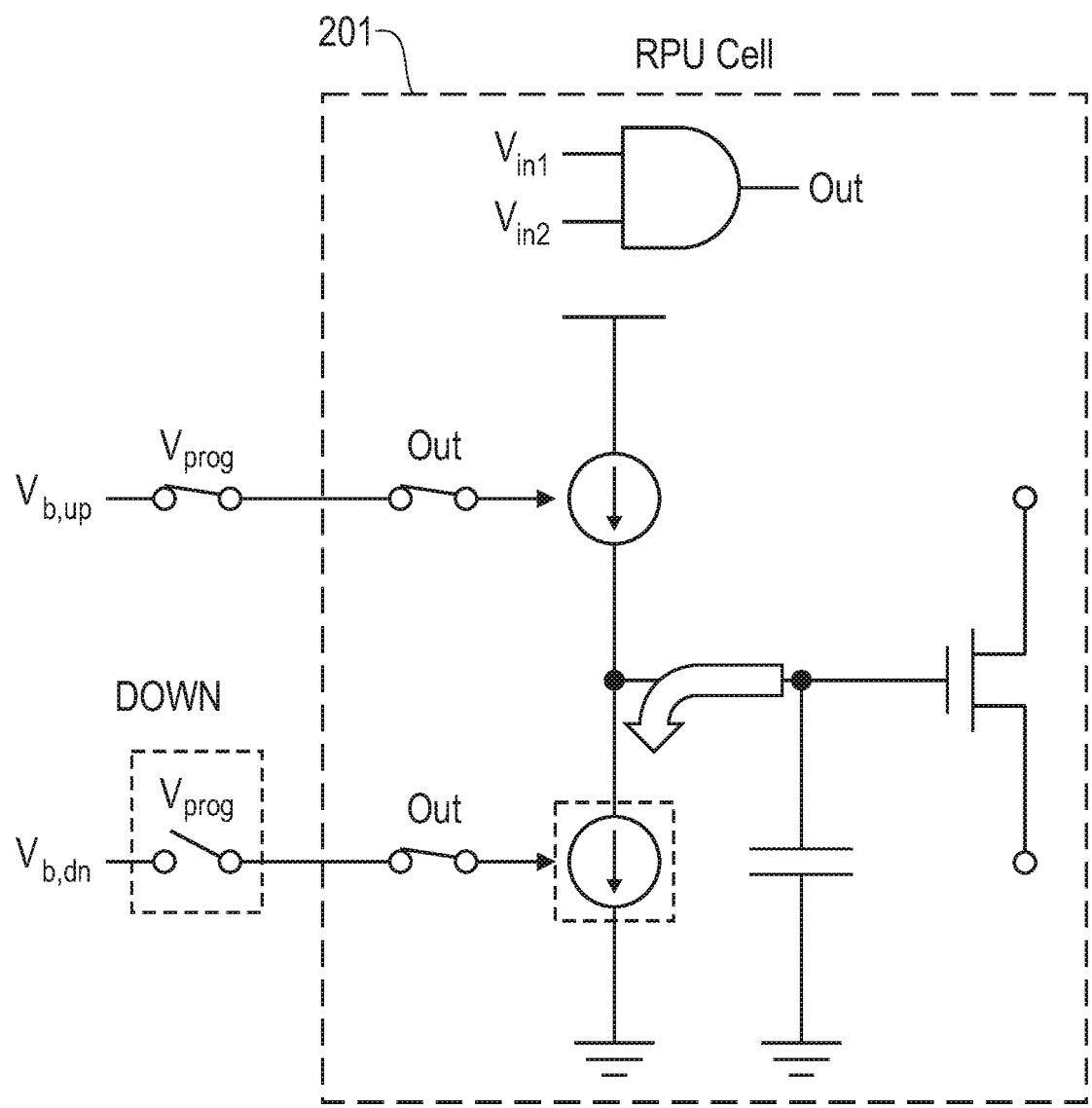

Referring now to FIGS. 2A-B, an exemplary conductive synapse is illustrated. RPU cell 201 is depicted during charging in FIG. 2A, and during discharging in FIG. 2B. This circuit design uses CMOS (Complementary metal-oxide-semiconductor) technology to provide programmable resistive cross point devices suitable as processing elements. In this approach, the processing of the data is performed by transistors and the local weight value is stored in the capacitor as a form of electric charge.

Two pairs of terminal circuits are provided. Two terminals are for updating and two terminals are for reading. Signals $V_{in1}$ and $V_{in2}$ from upstream and downstream synapses, respectively, are combined by an AND logic gate (or equivalent). When the inputs $V_{in}$ and $V_{in2}$ are both in the ON state, the AND gate combines these signals. This additional logic is required in order to ensure that the current source for charging is energized only when both upstream and downstream peripheral circuitry signal for a programming event.

Referring now to FIGS. 3A-D, an improved conductance-based synapse is illustrated according to embodiments of the present disclosure. Synapse 300 includes 3 transistors 301 . . . 303, 1 capacitor 304, and 1 resistor 305—no AND gate or other logic is necessary. The downstream peripheral circuitry directly controls the gates of the current source for charging ($m_2$) and the current source for discharging ($m_3$). The upstream peripheral circuitry controls the drain/source contacts of $m_2$ and $m_3$. In addition, a large resistor 305 is added in series with transistor 303 mRead in order to limit the read current to a suitable value. It will be appreciated that the 300 kΩ impedance pictured is only exemplary, and alternative resistors may be suitable for various applications.

Figure 3A:
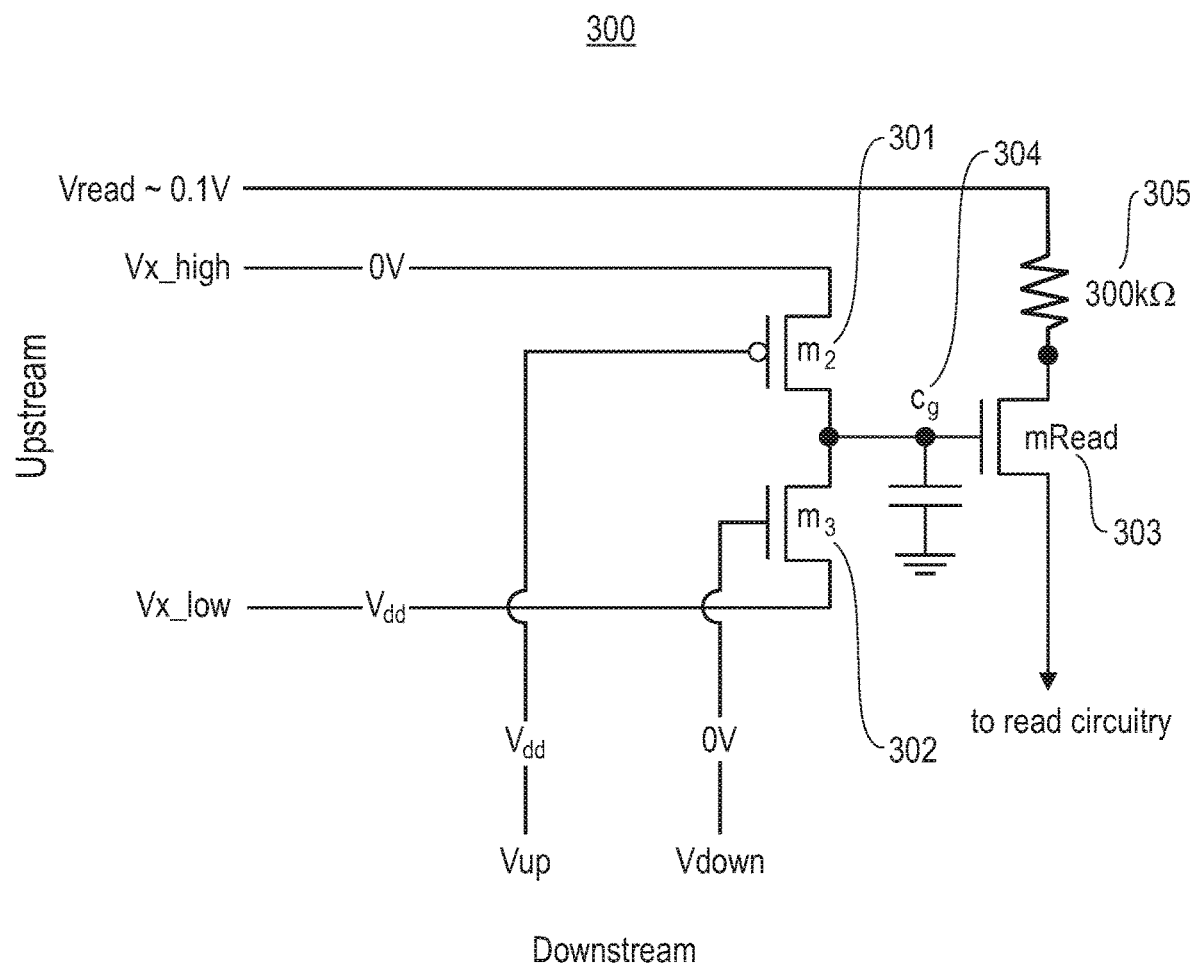
FIGS. 3A-D illustrate a conductance-based synapse according to embodiments of the present disclosure in various programming states.

As pictured in FIG. 3A, when both sets of peripheral circuitry are quiescent, then $m_2$ is turned off due to a high voltage on the PFET gate and a low voltage on its outer drain/source contact. Similarly, $m_3$ is turned off due to a low voltage on the NFET gate and a high voltage on its outer drain/source contact. Accordingly, no programming occurs.

Figure 3B:
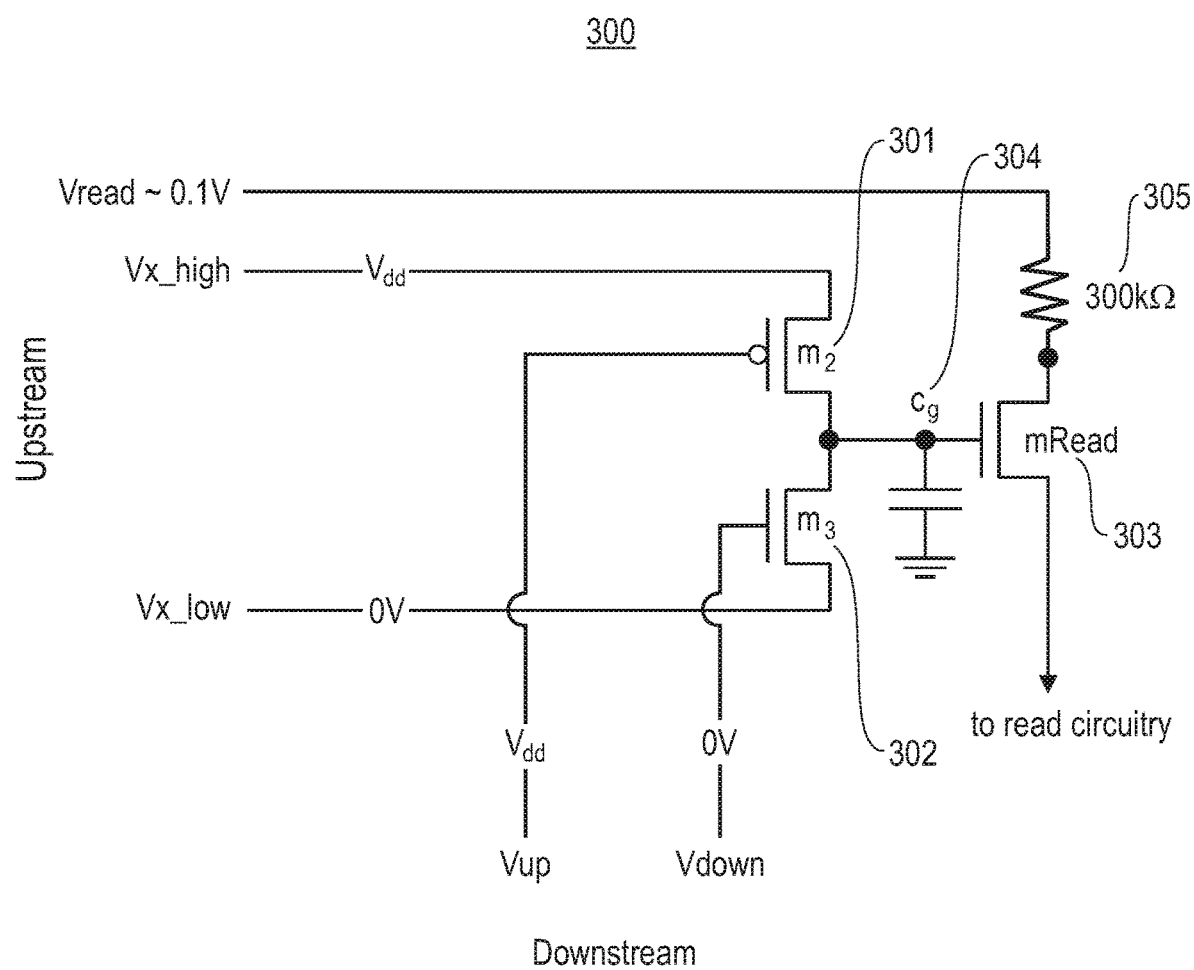

In FIG. 3B, the upstream peripheral circuitry is signaling for a weight update but the downstream peripheral circuitry is not. Since the upstream circuitry typically does not have information about the intended sign of the update, it raises the outer drain/source contact of $m_2$ to $V_{dd}$ and lowers the outer drain/source contact of $m_3$, providing necessary but not sufficient conditions for weight update by charge/discharge of the capacitor 304 $C_g$. Because the gate voltages of both $m_2$ and $m_3$ remain in an OFF condition, no programming occurs.

Figure 3C:
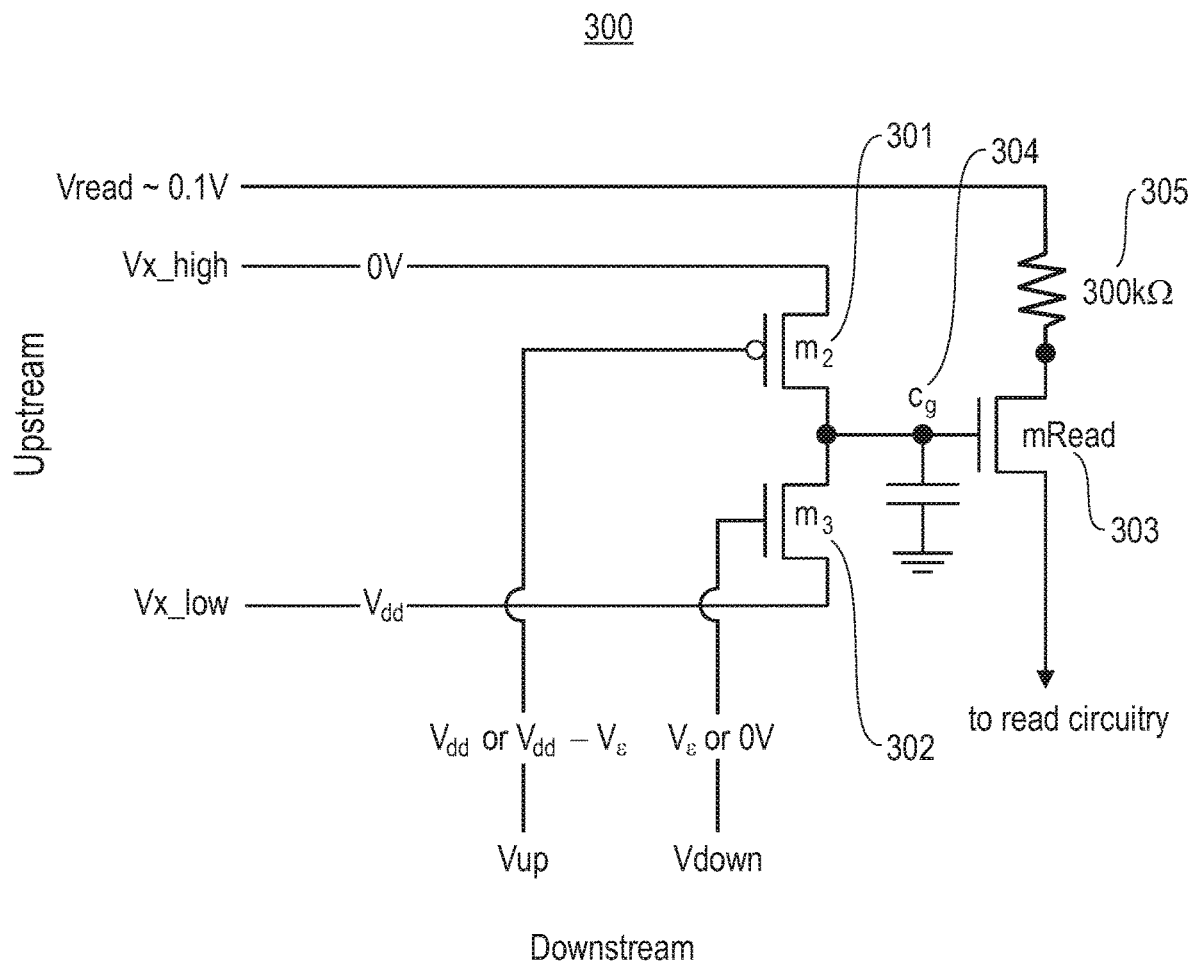

In FIG. 3C, the downstream peripheral circuitry is signaling for a weight update but the upstream peripheral circuitry is not. In this case, the outer drain/source contacts of $m_2$ and $m_3$ remain at 0V and $V_{dd}$, respectively, because the upstream peripheral circuitry is not signaling for a weight update. The downstream synapse has lowered the gate voltage of $m_2$ by a small amount ($V_e$) to signal a positive conductance update, or it has raised the gate voltage of $m_3$ by a similar small amount ($V_e$) to signal a negative conductance update, but not both. In some embodiments, the change in voltage may be on the order of hundreds of millivolts. Even with this change in one of the two gate voltages, because of the suppressing voltage being applied to the outer drain/source contacts of $m_2$ and $m_3$ by the upstream peripheral circuitry, no weight programming operation can occur for any moderate voltage on $C_g$.

Figure 3D:
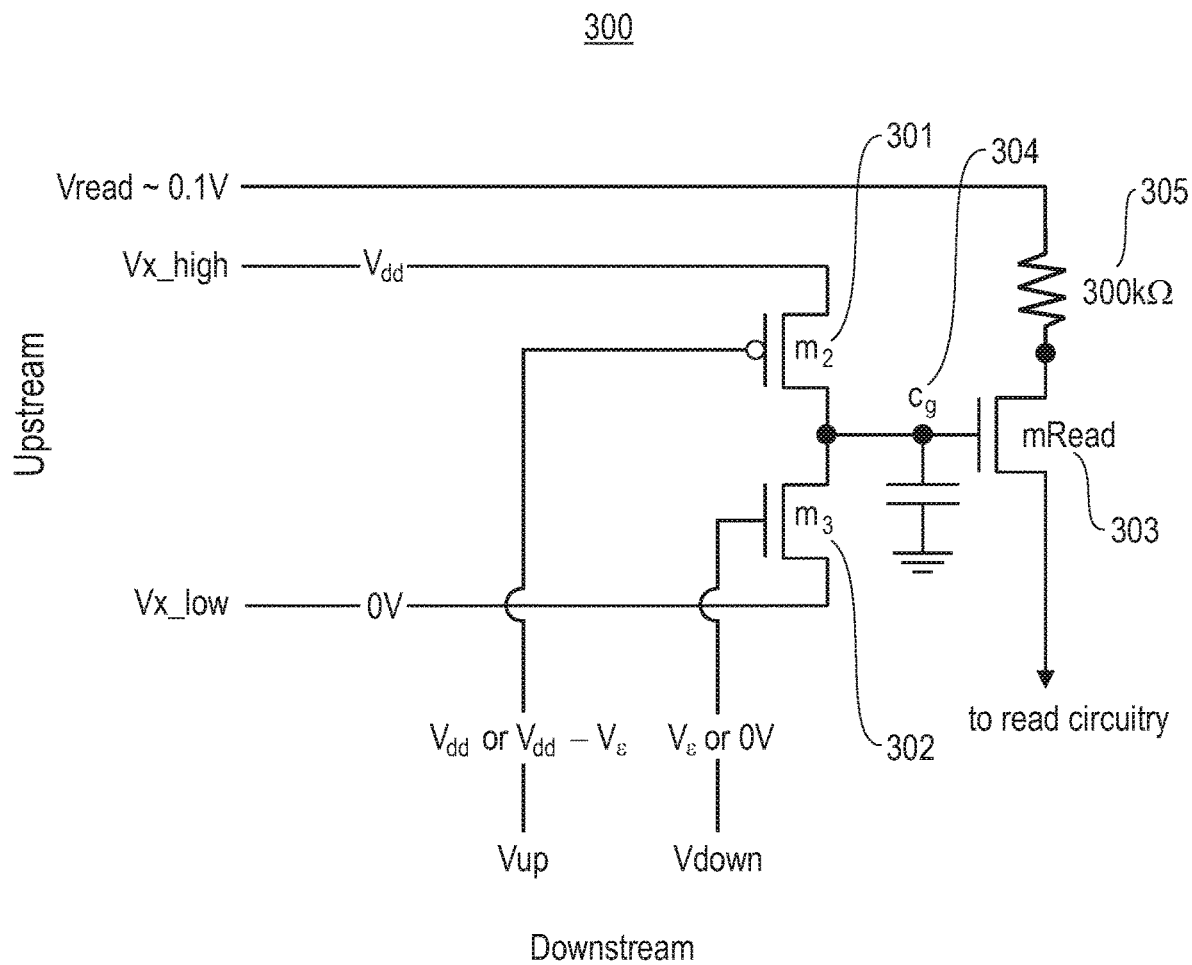

In FIG. 3D, both downstream and upstream peripheral circuitry are signaling for a weight update. The outer drain/source contact of $m_2$ is raised to $V_{dd}$ and the outer drain/source contact of $m_3$ is lowered. One (but not both) of the gates of $m_2$ or $m_3$ is moved away from the voltage rails (e.g., by a few hundred millivolts). Thus, while the upstream peripheral circuitry is signaling for a weight update of any sign, and the downstream neuron is signaling for a positive conductance update, then the gate voltage on $m_2$ and its outer drain/source contact are both in position to allow current to pass through $m_2$ and add to the charge on $C_g$. Similarly, while the upstream peripheral circuitry is signaling for a weight update of any sign, and the downstream neuron is signaling for a negative conductance update, then the gate voltage on $m_3$ and its outer drain/source contact are both in position to allow current to pass through $m_3$ and subtract from the charge on $C_g$.

Figure 4:
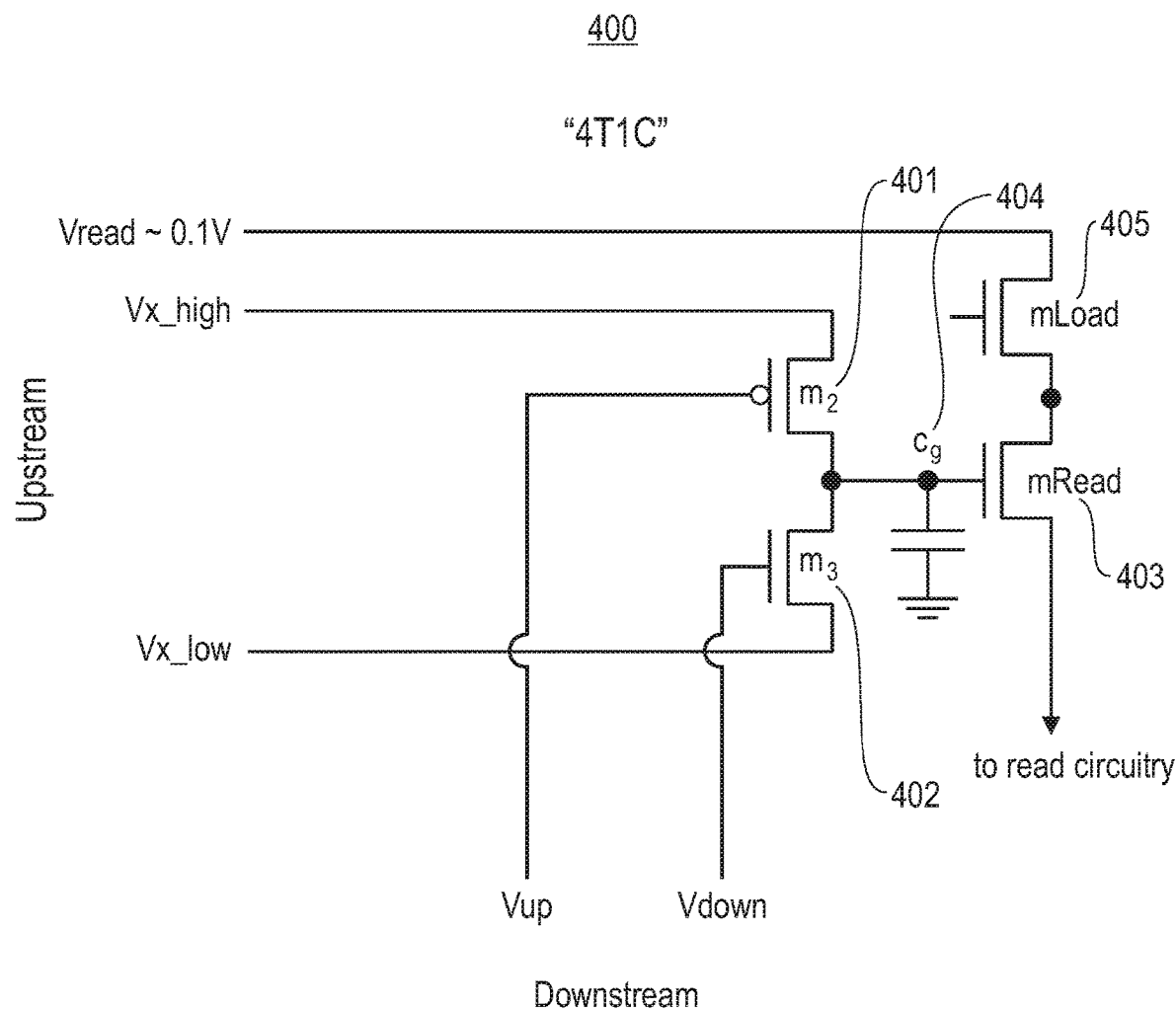
FIG. 4 illustrates another conductance-based synapse according to embodiments of the present disclosure.

Referring to FIG. 4, another improved conductance-based synapse is illustrated according to embodiments of the present disclosure. Synapse 400 includes three transistors 401 . . . 403, and one capacitor 404. Unlike the embodiments discussed above with regard to FIG. 3, a fourth transistor 405 is included to serve as a load device limiting the read current. The operation of the synapse of FIG. 4 is otherwise similar to that of the synapse of FIG. 3. The downstream peripheral circuitry directly controls the gates of the current source for charging ($m_2$) and the current source for discharging ($m_3$). The upstream peripheral circuitry controls the drain/source contacts of $m_2$ and $m_3$.

As set out herein, various embodiments of the present disclosure include a conductance-based synapse, including a circuit having at least two single-transistor current sources connected in series, and a capacitor connected with the at least two current sources. The capacitor provides a weight based on a charge level of the capacitor. The capacitor is charged or discharged by one of the at least two current sources.

In various embodiments, the resistive processing unit further includes a readout transistor connected to the capacitor. The readout transistor converts the voltage at the capacitor to a conductance which is accessible from the source-drain terminals of the readout transistor by applying a read voltage. The readout path may also include a load device to keep the read current from becoming excessive, either as a resistor or as a fourth transistor. The bias voltages to the gate terminals of the current source transistors are supplied from the downstream peripheral circuitry. The other terminals of the current source transistors are not connected to ground and supply voltages, but instead are controlled by the upstream peripheral circuitry. The readout transistor and current sources each comprise one complementary-metal-oxide-semiconductor (CMOS) transistor. An array of resistive processing units includes a plurality of the resistive processing units. The plurality of resistive processing units is configured in a cross-point array to train a neural network.

In various embodiments, a method of operating conductance-based synapse is provided. A capacitor of the resistive processing unit is charged or discharged by one of at least two series of connected single-transistor current sources under peripheral circuit control using no additional logic circuitry. A weight based on a charge level of the capacitor connected is provided to the current sources.

In various embodiments, a stored voltage is read out of the capacitor by a read out transistor connected to the capacitor. A read out transistor connected to the capacitor converts the voltage at the capacitor to a conductance accessible from source-drain terminals of the readout transistor by applying a read voltage. Bias voltages are supplied to the gate terminals of the current source transistors from the downstream peripheral circuitry. The drain/source contacts of the current source transistors not connected to the capacitor are controlled from the upstream peripheral circuitry. These two sets of peripheral circuits provide global control signals for rows and columns of the resistive processing units configured in an array. The read transistor and current sources can each be a complementary-metal-oxide-semiconductor (CMOS) transistor. The plurality of resistive processing units may be configured as a cross-point array to train a neural network.

Figure 5:
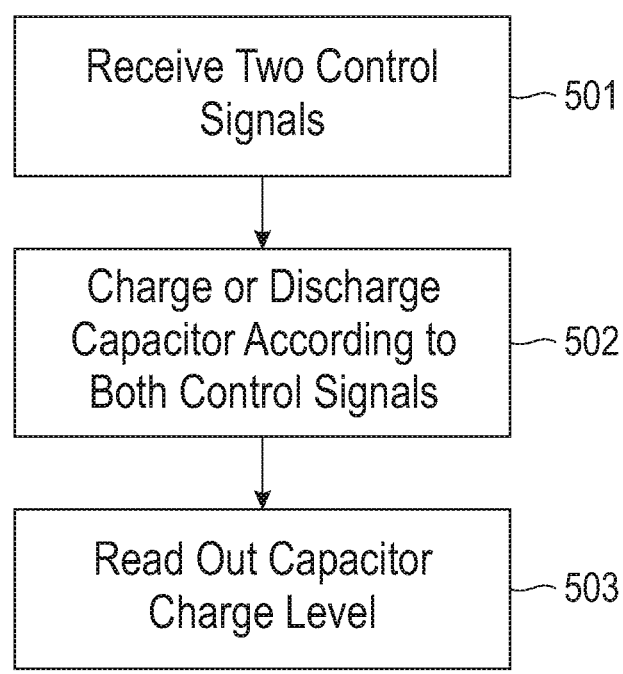
FIG. 5 illustrates a method for training an artificial neural network according to embodiments of the present disclosure.

Referring now to FIG. 5, a method of training an artificial neural network is illustrated according to embodiments of the present disclosure. A control signal is received at a synapse from a first control circuit and from a second control circuit. The synapse comprises first and second single-transistor current sources electrically coupled in series and a capacitor electrically coupled to the first and second single-transistor current sources. The first single-transistor current source is electrically coupled to the first and second control circuit. The second single-transistor current source is electrically coupled to the first and second control circuit. The capacitor is charged or discharged according to the control signal received from both the first and second control circuits.

It will be appreciated that a synapse as described may be part of an artificial neural network. In various embodiments, the neural network is connected to a conventional computing node. The computing node provides inputs to the artificial neural network, receives outputs, and initiates training. It will be appreciated that the neural network may have any number of hidden layers. In some embodiments, as described above, backpropagation may be applied to train the neural network. However, alternative training methods known in the art may be used to train neural networks according to the present disclosure.

Figure 6:
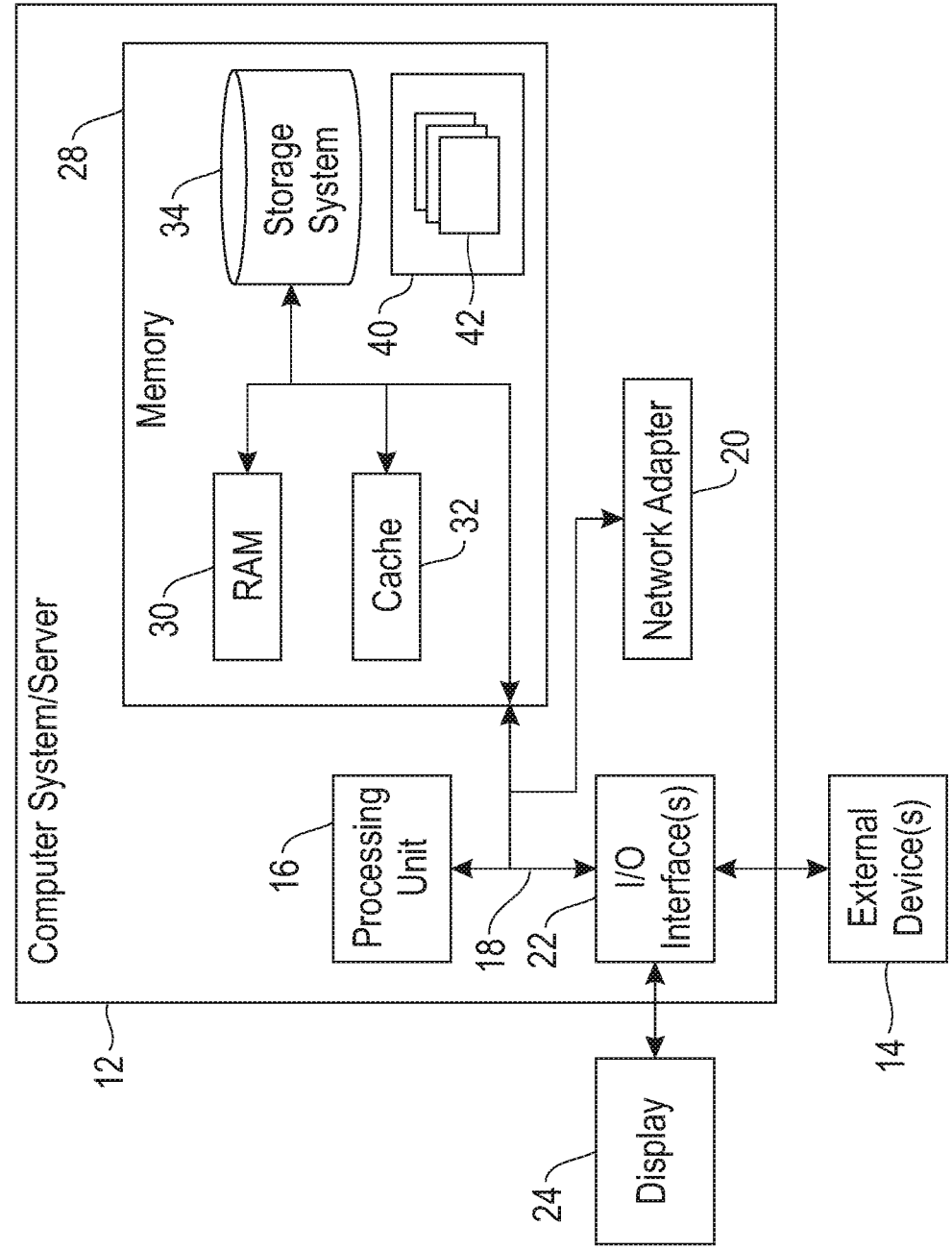
FIG. 6 depicts a computing node according to embodiments of the present disclosure.

Referring now to FIG. 6, a schematic of an example of a computing node is shown. Computing node 10 is only one example of a suitable computing node and is not intended to suggest any limitation as to the scope of use or functionality of embodiments of the invention described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 6, computer system/server 12 in computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
   first and second single-transistor current sources electrically coupled in series,
      the first single-transistor current source being electrically coupled to both a first control circuit and a second control circuit, free of any intervening logic gate between the first single-transistor current source and either one of the control circuits,
      the second single-transistor current source being electrically coupled to both the first control circuit and the second control circuit, free of any intervening logic gate between the second single-transistor current source and either one of the control circuits;
   a capacitor electrically coupled to the first and second single-transistor current sources;
   a read circuit electrically coupled to the capacitor, wherein
      the first and second single-transistor current sources are adapted to charge the capacitor only when concurrently receiving a control signal from each of the first control circuit and the second control circuit;
      the first and second single-transistor current sources are adapted to discharge the capacitor only when concurrently receiving a control signal from each of the first control circuit and the second control circuit, wherein at least one of the control signal from the first control circuit and the control signal from the second control circuit include three or more variable values, wherein the capacitor is charged or discharged based on both the control signals from the first control circuit and the control signal from the second control circuit.

2. The device of claim 1, wherein the charge level of the capacitor corresponds to a synaptic weight.

3. The device of claim 1, wherein the read circuit is adapted to receive a stored voltage of the capacitor.

4. The device of claim 1, wherein the read circuit comprises an output transistor, the transistor adapted to output a stored voltage of the capacitor.

5. The device of claim 1, wherein the read circuit comprises an output transistor, the output transistor adapted to translate a stored voltage of the capacitor to a conductance across the output transistor.

6. The device of claim 5, wherein the read circuit is adapted to provide the conductance upon application of a read voltage.

7. The device of claim 5, wherein the read circuit further comprises a load device electrically coupled to the transistor in series.

8. The device of claim 7, wherein the load device comprises a resistor.

9. The device of claim 7, wherein the load device comprises a transistor.

10. The device of claim 9, wherein the transistor comprises a complementary-metal-oxide-semiconductor transistor.

11. The device of claim 1, wherein:
the first control circuit is electrically coupled to a gate terminal of each of the first and second single-transistor current sources,
the first control circuit is adapted to provide a bias voltage to each of the first and second single-transistor current sources, and
the second control circuit is electrically coupled to a source or drain terminal of each of the first and second single-transistor current sources.

12. The device of claim 1, wherein the first or second single-transistor current source comprises a complementary-metal-oxide-semiconductor transistor.

13. An artificial neural network comprising a plurality of neurons interconnected by a plurality of synapses, each synapse comprising:
first and second single-transistor current sources electrically coupled in series,
the first single-transistor current source being electrically coupled to both a first control circuit and a second control circuit, free of any intervening logic gate between the first single-transistor current source and either one of the control circuits,
the second single-transistor current source being electrically coupled to both the first control circuit and the second control circuit, free of any intervening logic gate between the second single-transistor current source and either one of the control circuits;
a capacitor electrically coupled to the first and second single-transistor current sources;
a read circuit electrically coupled to the capacitor, wherein
the first and second single-transistor current sources are adapted to charge the capacitor only when concurrently receiving a control signal from each of the first control circuit and the second control circuit; and
the first and second single-transistor current sources are adapted to discharge the capacitor only when concurrently receiving a control signal from each of the first control circuit and the second control circuit, wherein at least one of the control signal from the first control circuit and the control signal from the second control circuit include three or more variable values.

14. The artificial neural network of claim 13, wherein the charge level of the capacitor corresponds to a synaptic weight.

15. The artificial neural network of claim 14, wherein the read circuit is adapted to receive a stored voltage of the capacitor.

16. The artificial neural network of claim 14, wherein the read circuit comprises an output transistor, the transistor adapted to output a stored voltage of the capacitor.

17. The artificial neural network of claim 14, wherein the read circuit comprises an output transistor, the output transistor adapted to translate a stored voltage of the capacitor to a conductance across the output transistor.

18. The artificial neural network of claim 14, wherein:
the first control circuit is electrically coupled to a gate terminal of each of the first and second single-transistor current sources,
the first control circuit is adapted to provide a bias voltage to each of the first and second single-transistor current sources, and
the second control circuit is electrically coupled to a source or drain terminal of each of the first and second single-transistor current sources.

19. A method of training an artificial neural network, the method comprising:
receiving at a synapse a control signal from a first control circuit and a control signal from a second control circuit,
the synapse comprising a first and second single-transistor current sources electrically coupled in series and a capacitor electrically coupled to the first and second single-transistor current sources,
the first single-transistor current source being electrically coupled to both the first control circuit and the second control circuit, free of any intervening logic gate between the first single-transistor current source and either one of the control circuits,
the second single-transistor current source being electrically coupled to both the first control circuit and the second control circuit, free of any intervening logic gate between the second single-transistor current source and either one of the control circuits; and
charging or discharging the capacitor according to the control signal received from each of the first control circuit and the second control circuit, wherein at least one of the control signal from the first control circuit and the control signal from the second control circuit include three or more variable values, wherein the capacitor is charged or discharged based on both the control signals from the first control circuit and the control signal from the second control circuit.

20. A conductance-based synapse, comprising:
a circuit comprising:
at least two sets of peripheral control circuitry,
at least two single-transistor current sources connected in series,
a capacitor connected with the at least two single-transistor current sources,
the capacitor providing a weight based on a charge level of the capacitor, wherein
the capacitor is charged or discharged by at least one of the at least two single-transistor current sources only when the at least two sets of peripheral control circuitry are concurrently signaling for a charge or discharge event, wherein the signaling from at least one of of the at least two sets of peripheral control circuitry includes three or more variable values.

21. The conductance-based synapse according to claim 20, further comprising a readout transistor connected to the capacitor, wherein a stored voltage of the capacitor is mapped to a read current by the readout transistor.

22. The conductance-based synapse according to claim 21, wherein the readout transistor converts the voltage at the capacitor to conductance which is accessible from a source-drain terminals of the read out transistor by applying a read voltage.

23. The conductance-based synapse according to claim 20, wherein the bias voltages to a gate terminal of single-transistor current sources are supplied from one of the at least two sets of peripheral control circuitry, with the other set of peripheral control circuitry controlling the single-transistor current source directly through the source/drain contact not connected to the capacitor.

24. The conductance-based synapse according to claim 20, wherein the readout transistor and single-transistor current sources each comprise a complementary-metal-oxide-semiconductor (CMOS) transistor.

25. The conductance-based synapse according to claim 20, wherein the readout transistor is in series with a load device to limit the read out current.

26. The conductance-based synapse according to claim 25, wherein the load device is a resistor.

27. The conductance-based synapse according to claim 26, wherein the load device is a complementary-metal-oxide-semiconductor (CMOS) transistor.

28. An array of conductance-based synapses comprising a plurality of the conductance-based synapses according to claim 20.

29. The array of conductance-based synapses according to claim 28, wherein the plurality of the conductance-based synapses are configured in a cross-point array to train a neural network.

* * * * *